United States Patent
Robinson et al.

(10) Patent No.: US 10,735,040 B2
(45) Date of Patent: Aug. 4, 2020

(54) ELECTRONIC GAIN SHAPER AND A METHOD FOR STORING PARAMETERS

(71) Applicants: Ashley Robinson, Eight Mile Plains (AU); Nimish Pandey, Chapel Hill (AU)

(72) Inventors: Ashley Robinson, Eight Mile Plains (AU); Nimish Pandey, Chapel Hill (AU)

(73) Assignee: L3HARRIS TECHNOLOGIES, Melbourne, FL (US)

( * ) Notice: Subject to any disclaimer, the term of this patent is extended or adjusted under 35 U.S.C. 154(b) by 0 days.

(21) Appl. No.: 16/168,227

(22) Filed: Oct. 23, 2018

(65) Prior Publication Data

US 2019/0123773 A1    Apr. 25, 2019

Related U.S. Application Data

(63) Continuation of application No. 14/379,699, filed as application No. PCT/AU2013/000175 on Feb. 28, 2013, now abandoned.

(30) Foreign Application Priority Data

Feb. 29, 2012  (AU) ................................ 2012900784

(51) Int. Cl.
*H04B 1/00*       (2006.01)
*H04B 1/16*       (2006.01)
(Continued)

(52) U.S. Cl.
CPC ............ *H04B 1/16* (2013.01); *H04B 1/1638* (2013.01); *H04B 17/29* (2015.01); *H03G 5/165* (2013.01);
(Continued)

(58) Field of Classification Search
CPC ........ H04B 1/16; H04B 17/29; H04B 1/1638; H03G 5/165; H03H 7/0123; H03H 7/06; H03H 2210/028
(Continued)

(56) References Cited

U.S. PATENT DOCUMENTS 3,648,200 A * 3/1972 Harrison ................. H01P 1/201
                                                  333/211
4,571,563 A    2/1986 Cameron
(Continued)

FOREIGN PATENT DOCUMENTS

| EP | 2382684 A1 | 11/2011 |
| WO | 2010084519 A1 | 7/2010 |
| WO | 2012011141 A1 | 1/2012 |

OTHER PUBLICATIONS

International Search Report, PCT/AU2013/000175, dated May 22, 2013.
(Continued)

*Primary Examiner* — Sonny Trinh
(74) *Attorney, Agent, or Firm* — Walter Haverfield, LLP; James J. Pingor

(57) ABSTRACT

There is provided an electronic gain shaper for open loop adaptive optimising of broadband microwave circuits, the gain shaper comprising operating parameter selection means adapted for providing one or more operating parameters; and a lossy tuning element operably coupled to the operating parameter selection means, wherein, in use, the gain shaper is adapted for receiving an operating mode; retrieving an operating parameter from the operating parameter selection means in accordance with the operating mode; and configuring the lossy tuning element in accordance with the operating parameter.

18 Claims, 10 Drawing Sheets

(51) Int. Cl.
   *H04B 17/29* (2015.01)
   *H03H 7/06* (2006.01)
   *H03H 7/01* (2006.01)
   *H03G 5/16* (2006.01)

(52) U.S. Cl.
   CPC ............ *H03H 7/0123* (2013.01); *H03H 7/06* (2013.01); *H03H 2210/028* (2013.01)

(58) Field of Classification Search
   USPC .................. 455/120, 121, 125, 232.1, 245.1
   See application file for complete search history.

(56) References Cited

U.S. PATENT DOCUMENTS

| | | | |
|---|---|---|---|
| 4,868,575 A * | 9/1989 | Mok ........................ | H01P 1/182 342/373 |
| 4,870,658 A | 9/1989 | Suzuki | |
| 5,235,295 A | 8/1993 | Barbaste et al. | |
| 5,274,339 A | 12/1993 | Wideman | |
| 5,363,069 A | 11/1994 | Sadhir | |
| 5,521,554 A | 5/1996 | Okazaki | |
| 6,061,025 A * | 5/2000 | Jackson ................... | H01Q 1/38 343/700 MS |
| 6,097,347 A * | 8/2000 | Duan ...................... | H01Q 1/2225 343/802 |
| 6,252,461 B1 | 6/2001 | Raab | |
| 6,418,301 B1 | 7/2002 | Le et al. | |
| 2003/0052739 A1 | 3/2003 | Analui | |
| 2003/0062967 A1 | 4/2003 | Ritchey | |
| 2004/0056717 A1 | 3/2004 | Yin | |
| 2004/0061572 A1 | 4/2004 | Nakamura | |
| 2004/0063415 A1 | 4/2004 | Python et al. | |
| 2004/0127178 A1 * | 7/2004 | Kuffner ................... | H01P 1/15 455/133 |
| 2005/0009472 A1 | 1/2005 | Shamsaifar | |
| 2005/0095998 A1 * | 5/2005 | Toncich ............. | G01R 27/2694 455/129 |
| 2005/0130699 A1 | 6/2005 | Kim | |
| 2007/0001906 A1 | 1/2007 | Pelzer | |
| 2007/0025435 A1 | 2/2007 | Cao | |
| 2007/0164731 A1 | 7/2007 | Pollock | |
| 2007/0194859 A1 * | 8/2007 | Brobston ................. | H03H 7/40 333/17.3 |
| 2008/0076353 A1 | 3/2008 | Rofougaran | |
| 2008/0119148 A1 | 5/2008 | Ray | |
| 2008/0305749 A1 * | 12/2008 | Ben-Bassat .............. | H01Q 1/24 455/77 |
| 2009/0130991 A1 | 5/2009 | Rofougaran et al. | |
| 2009/0251618 A1 * | 10/2009 | Gao ........................ | H03J 5/244 348/731 |
| 2010/0073103 A1 | 3/2010 | Spears | |
| 2010/0244576 A1 | 9/2010 | Hillan | |
| 2011/0068990 A1 | 3/2011 | Grzyb | |
| 2011/0086600 A1 * | 4/2011 | Muhammad ......... | H04B 1/0458 455/120 |
| 2011/0130104 A1 | 6/2011 | Villain | |
| 2011/0254643 A1 | 10/2011 | Iida | |
| 2012/0007696 A1 | 1/2012 | Pang | |
| 2013/0015836 A1 | 1/2013 | Chang | |
| 2013/0285875 A1 | 10/2013 | Kawahata | |
| 2014/0022132 A1 | 1/2014 | Badaruzzaman | |
| 2016/0181242 A1 | 6/2016 | Yook | |

OTHER PUBLICATIONS

Written Opinion of the International Searching Authority, PCT/AU2013/000175, dated May 22, 2013.

* cited by examiner (Comparison with Prior Art)

ELECTRONIC GAIN SHAPER AND A METHOD FOR STORING PARAMETERS

CROSS-REFERENCE TO RELATED APPLICATIONS

This application is a continuation of and claims priority to U.S. patent application Ser. No. 14/379,699 entitled "ELECTRONIC GAIN SHAPER AND A METHOD FOR STORING PARAMETERS" filed Aug. 19, 2014, which claims priority to pending PCT Application Serial No. PCT/AU2013/000175 entitled "AN ELECTRONIC GAIN SHAPER AND A METHOD FOR STORING PARAMETERS," filed Feb. 28, 2013, which claims priority to AU Application Serial No. AU20120900784, filed Feb. 29, 2012. The entireties of the above-noted applications are incorporated by reference herein.

FIELD OF THE INVENTION

The present invention relates to front-end signal processing and in particular to an electronic gain shaper and a method for storing parameters.

The invention has been developed primarily for use in front-end signal processing and will be described hereinafter with reference to this application. However, it will be appreciated that the invention is not limited to this particular field of use. Furthermore, while the embodiments described herein are primarily directed to electronic warfare (EW) receivers, the embodiments are equally applicable to EW transmitters also.

BACKGROUND

A typical broadband microwave receiver or transmitter for an electronic warfare (EW) front-end is not only required to meet tight gain specifications over a wide operating temperature range typically −54° C. to +85° C. for an airborne environment but must also operate across wide bandwidths (an octave or more), such as 2-18 GHz or wider.

In order to meet gain specification, existing arrangements comprise the once-off manual tuning of the response so as to meet the required gain specification. Such a manual tuning may comprise the manipulation of tuning stubs while viewing the frequency response using microwave network analyser. This current approach is not only time consuming and costly requiring highly skilled technicians to interpret the response variation from each stage of tuning, but is unable to account for dynamic gain-affecting factors, such as temperature.

While dynamic compensation exist within the prior art, such dynamic compensation is limited to narrowband application, and at least on account of gain drop-off with frequency, are unable to provide adaptive gain shaping across wide bandwidth, as is required for LW front ends in dynamic gain affecting conditions.

For example, U22008/0119148 A1 (Ray) relates to system for Low-noise amplifier (LNA) adjustment to compensate for dynamic impedance matching. Specifically, in Ray, performance is optimised by adding matching components to minimise reflections. These matching components are located at the point of the mismatch between two components in the circuit (typically the antenna).

US2009/0130991 A1 (Rofougaran et al) relates to storing radio station settings in accordance with location.

Furthermore, reference is made to FIG. 1 showing a comparison 50 of prior art arrangements and the embodiments described herein. Specifically, FIG. 1 shows a gain comparison of the frequency response of prior art narrow band matching 101 (such as provided by Ray) and the gain shaping 102 according to the embodiments described herein. Specifically, the prior art 101 offers device matching by using inductors and capacitors (or other elements such as transmission lines) to change the impedance presented to a device.

However, as is evident from the prior art 101, the gain drops off at higher frequencies rendering such prior art tuning techniques ill-suited for generating a flat response across a Wide bandwidth. Now, in many applications, such prior art approaches may be preferred as most applications have narrow bandwidth operating requirements. However, as alluded to above, EW front-ends operate over wide bandwidths, such as across 3-20 GHz as is provided by FIG. 1.

Existing arrangements that attempt to provide matching of impedance across a wide bandwidth require that the matching components must be placed as close to point of mismatch as possible. As the physical distance between the mismatch and the matching components increases, the rate of change in electrical distance between the components also increases leading to a greater change in the impedance presented across frequency. Furthermore, the majority of components do not have a constant impedance versus frequency that could easily be matched out using a single component across a wide instantaneous bandwidth, and therefore the performance of existing matching options is limited.

In contradistinction, the present embodiments described herein allow for dynamic gain shaping across wide bandwidths (described herein as across at least an octave of bandwidth) as is evident from the gain response of the present embodiments 101 showing the flatness of the matched circuit having a 3 dB flatness bandwidth of about 8 GHz to 11.1 GHz.

It is to be understood that, if any prior art information is referred to herein, such reference does not constitute an admission that the information forms part of the common general knowledge in the art, in Australia or any other country.

SUMMARY

The present invention seeks to provide an electronic gain shaper and a method for storing parameters, which will overcome or substantially ameliorate at least some of the deficiencies of the prior art, or to at least provide an alternative.

According to one aspect, there is provided an electronic gain shaper for open loop adaptive optimising of broadband microwave circuits, the gain shaper comprising operating parameter selection means adapted for providing one or more operating parameters; and a lossy tuning element operably coupled to the operating parameter selection means, wherein, in use, the gain shaper is adapted for receiving an operating mode; retrieving an operating parameter from the operating parameter selection means in accordance with the operating mode; configuring the lossy tuning element in accordance with the operating parameter.

Advantageously, the open loop adaptive electronic gain shaper may be deployed in the field allowing for on-the-fly front-end signal processing optimizing. The gain shaper can to be tuned according to one or more desired operating modes. Such desired operating modes may be configured according to various operating conditions including temperature, frequency gain and slope and the like, for example. In such a manner, rather than having to rely on fixed tuning (typically configured once at manufacture) unable to compensate for changing conditions, the gain shaper is adaptable to such changing conditions. Furthermore, the use of lossy tuning elements advantageously allows for positioning of the gain shaping circuitry at a position in the circuit cascade away from the point of initial mismatch that led to the gain ripple. The positioning of the gain shaper within the cascade is determined by complete circuit cascade, parameters such as noise figure and power compression, in addition to physical constraints such as volume or control wiring.

Preferably, the gain shaper further comprises a further tuning element operably coupled to the operating parameter selection means, wherein the lossy tuning element and the further lossy tuning element have centre frequencies at least substantially across an octave of bandwidth, wherein, in use, the gain shaper is further adapted for retrieving a further operating parameter from the operating parameter selection means in accordance with the operating mode; configuring the further lossy tuning element in accordance with the one or more operating parameters.

Advantageously, the gain shaper is adapted for providing adaptive gain shaping across a wide bandwidth, such as is required for EW front ends.

Preferably, the operating parameter selection means comprises storage means comprising a lookup table.

Preferably, the lookup table comprises one or more operating mode keys and one or more corresponding operating parameters, and wherein the lookup table is adapted for providing at least one of the one or more corresponding operating parameters in accordance with at least one of the one or more operating mode keys.

Advantageously, the gain shaper allows for digital control, wherein the operating parameters are retrievable from a digital lookup table. Furthermore, the values of the lookup table may be loaded into each gain shaper at manufacture, negating the need for manual configuration. Furthermore, a large lookup table allows for the storage of a large number of operating parameters, allowing the gain shaper to adapt to many differing operating modes.

Preferably, the operating parameter selection means comprises an FPGA device.

Advantageously, the FPGA allows for the high speed control of the gain shaper, especially advantageous in signal processing.

Preferably, the one or more operating parameters comprise a resistance parameter.

Advantageously, the resistance parameter may be used to configure one or more variable resistive elements of the one or more tuning elements.

Preferably, the one or more tuning elements comprise an electronically variable resistive element.

Advantageously, the response of the one or more tuning elements may be configured in accordance with one or more resistance settings.

Preferably, the variable resistive element comprises a PIN diode.

Advantageously, PIN diodes are suited for microwave hybrid circuits.

Preferably, the gain shaper is adapted for configuring the resistance of PIN diode in accordance with a bias current.

Preferably, the open loop adaptive electronic gain shaper further comprises a variable analogue circuit for providing the bias current.

Preferably, the open loop adaptive electronic gain shaper further comprises a digital to analogue converter coupled to the operating parameter selection means for providing the bias current.

Advantageously, the PIN diode allows for the digital or analogue control of the one or more tuning elements by way of a bias current.

Preferably, the operating parameter represents a gain parameter.

Preferably, the open loop adaptive electronic gain shaper further comprises gain compensation means operably coupled to the operating parameter selection means, and wherein the gain shaper is adapted to switch-in or switch-out the gain compensation means in accordance with gain parameter.

Advantageously, the gain response of the gain shaper may e controlled using the gain compensation means.

Preferably, the one or more tuning elements comprise at least one of a positive slope equalizer and a negative slope equalizer.

Preferably, the positive slope equalizer comprises a short circuit stub.

Preferably, the negative slope equalizer comprises an open circuit stub.

Preferably, wherein the lossy tuning element is connected to a high Q-value resonant circuit.

Advantageously, the high Q-value tuning elements provide tunable frequency through the use of electronically variable element such as a varactor.

Preferably, the resonant frequency of the resonant circuit is tunable.

Advantageously, by cascading tuning elements, the response of the gain shaper is further configurable, allowing for n-th order frequency response curves.

Preferably, the operating mode is selected in accordance with an operating temperature.

Preferably, in use, the gain shaper is adapted for receiving a temperature reading, and wherein receiving the operating mode comprises selecting the operating mode in accordance with the temperature reading.

Advantageously, the operating parameters of the gain shaper may be configured as a function of temperature such that the gain shaper is able to adapt to fluctuations in temperature.

According to another aspect, there is provided a method for storing one or more operating parameters in relation to an operating mode, the method comprising selecting a desired response in accordance with the operating mode; coupling a tuning element network to a frequency analyser, the tuning element network comprising at least one lossy tuning element configurable in accordance with the at least one operating parameter; measuring a response of the tuning element using the frequency analyser; configuring the at least one operating parameter in accordance with the response and the desired response; and storing the at least one operating parameter in a lookup table in relation to the operating mode.

Advantageously, the method is adapted for selecting optimal operating parameter values for storage in the operating parameter selection means.

Other aspects of the invention are also disclosed.

BRIEF DESCRIPTION OF THE DRAWINGS

Notwithstanding any other forms which may fall within the scope of the present invention, a preferred embodiments of the invention will now be described, by way of example only, with reference to the accompanying drawings in which.

DESCRIPTION OF EMBODIMENTS

Figure 1:
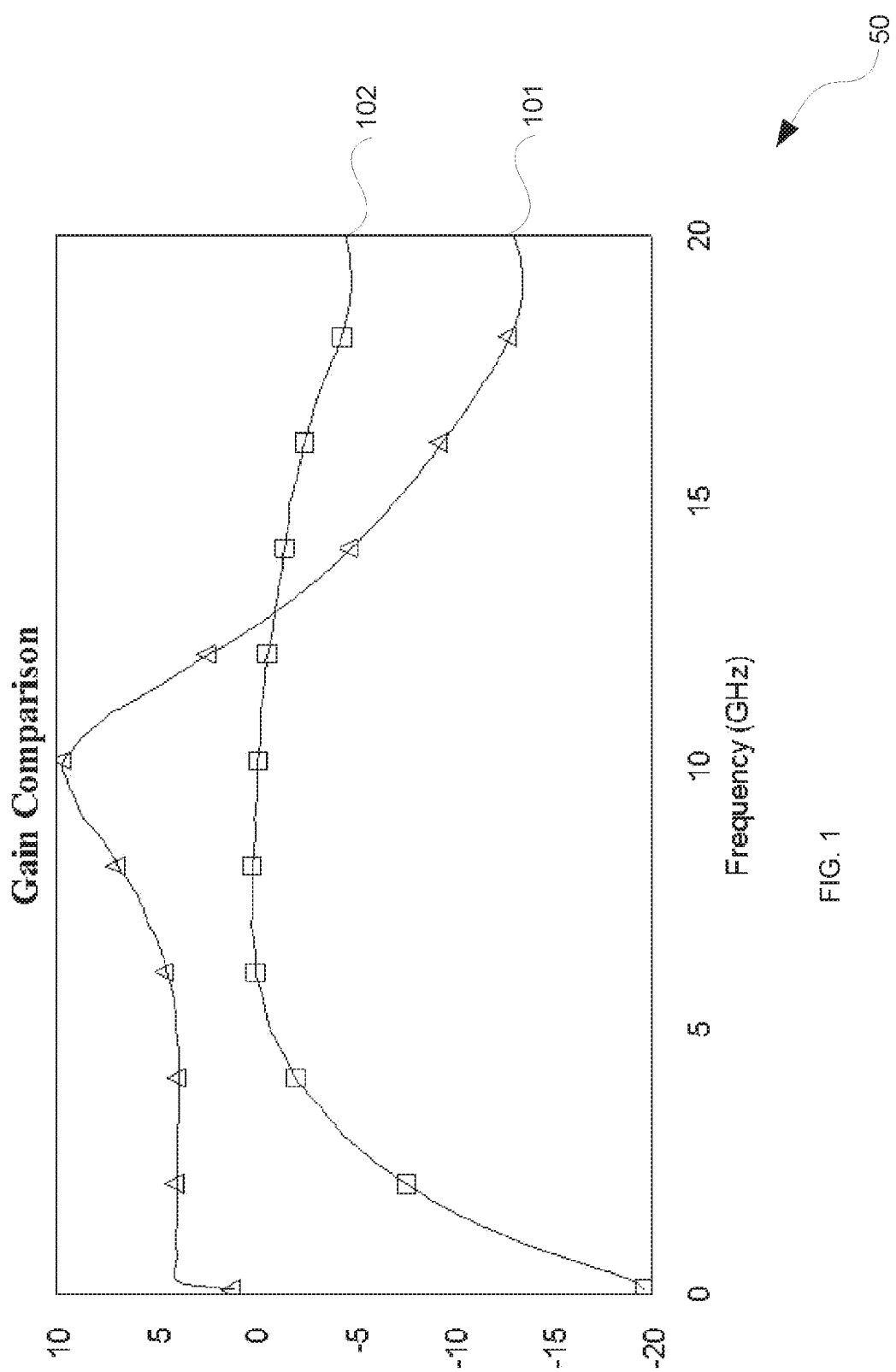
FIG. 1 shows a comparison of prior art arrangements and the embodiments described herein.

It should be noted in the following description that like or the same reference numerals in different embodiments denote the same or similar features.

Electronic Gain Shaper

There is disclosed herein an electronic gain shaper for open loop adaptive optimising of broadband microwave circuits. As is evident from the below technical disclosure, the open loop adaptive electronic gain shaper is adapted for in use optimisation, allowing the open loop adaptive electronic gain shaper to be tuned according to one or more desired operating modes, such as temperature drift. In such a manner, rather than having to rely on a fixed tuning, such as configured once at manufacture, the open loop electronic gain shaper allows for adaptive configuration to compensate for dynamic variables. Furthermore, as will be apparent from the description below, the gain shaper provides configurable gain compensation across a wide bandwidth, so as to be suitable for EW front ends, for example.

As is described in further detail below, the open loop adaptive electronic gain shaper comprises electronically variable RF (lossy) tuning circuits operably coupled to a high speed FPGA comprising one or more lookup tables allowing for the gain shaper response to be electronically tuned on-the-fly. In this manner, one or more operating parameters may be selected in accordance with a selected operating mode.

For example, at a first temperature the lookup table may comprise one or more operating parameters for configuring one or more tuning elements to provide the correct gain compensation. Upon a drift in temperature, the lookup table may comprise further operating parameters for configuring the one or more tuning elements to provide a second frequency response adapted to the change in temperature.

Figure 2:
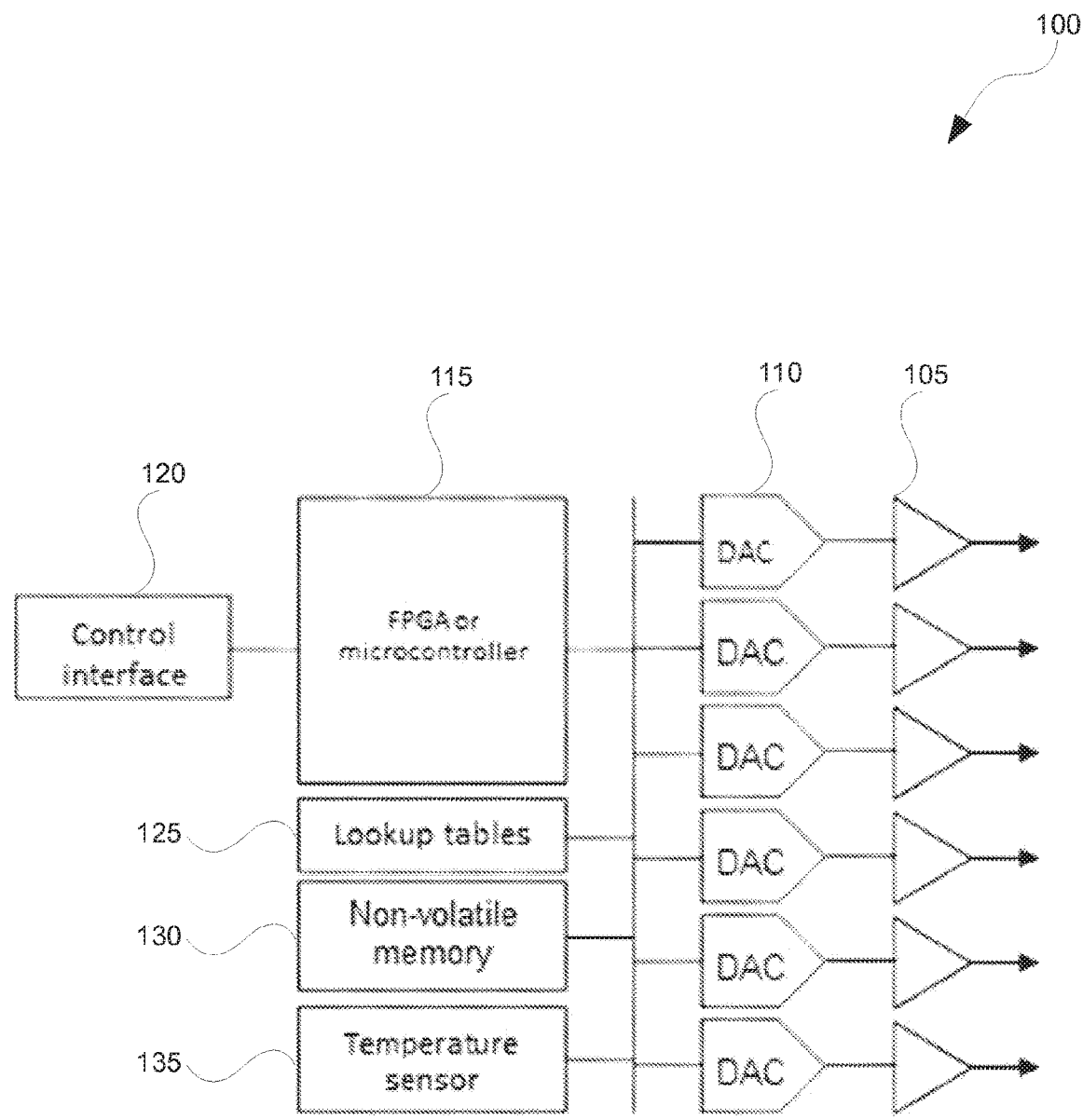
FIG. 2 is shows operating parameter selection means in accordance with a preferred embodiment of the present invention.
Figure 3:
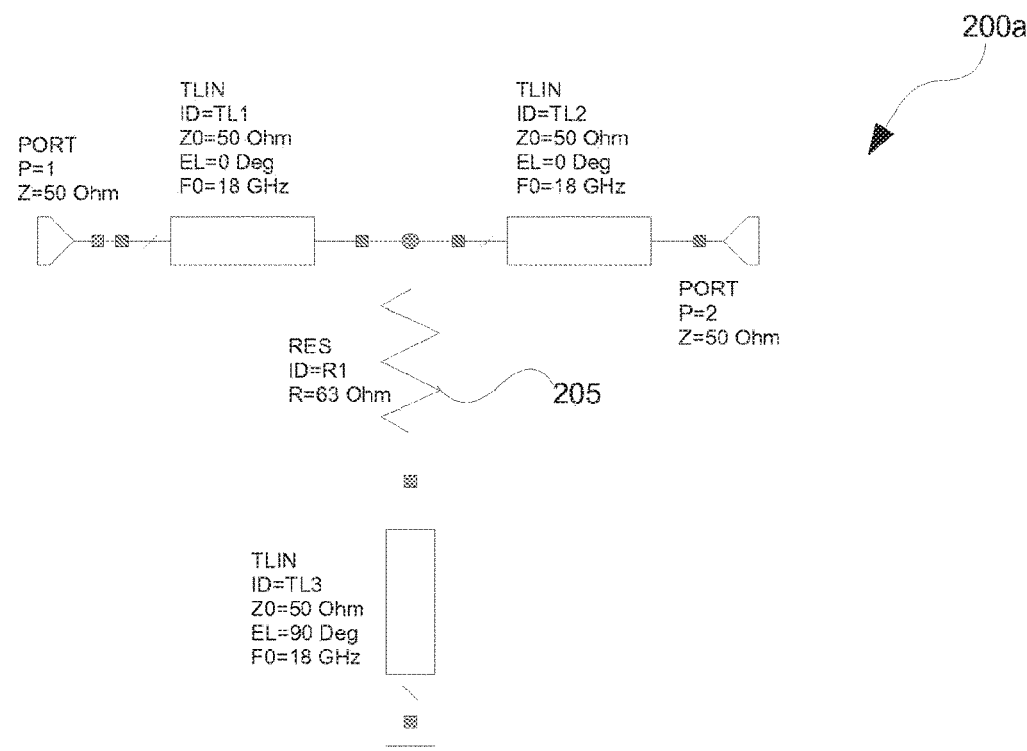
FIGS. 3 and 4 show exemplary electronic tuning circuits and their responses.
Figure 3:
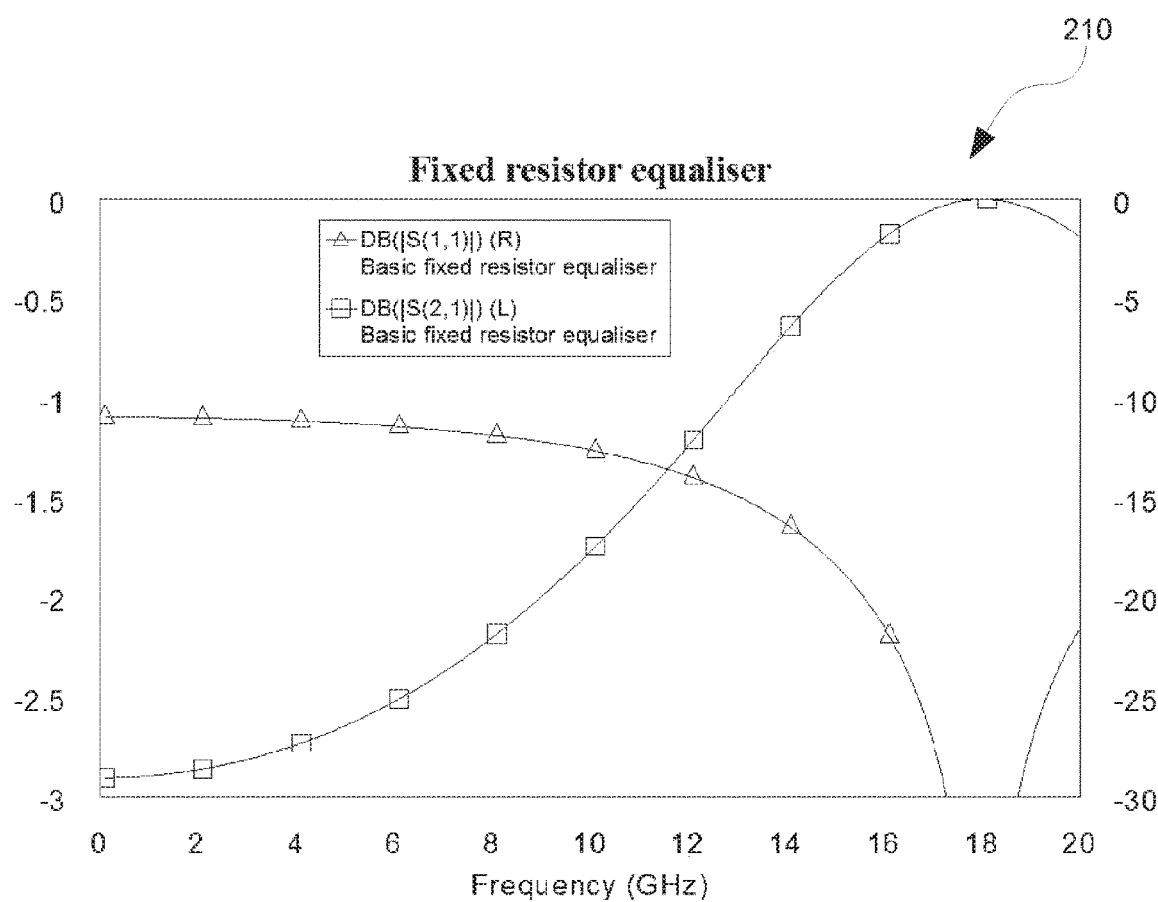
Figure 5:
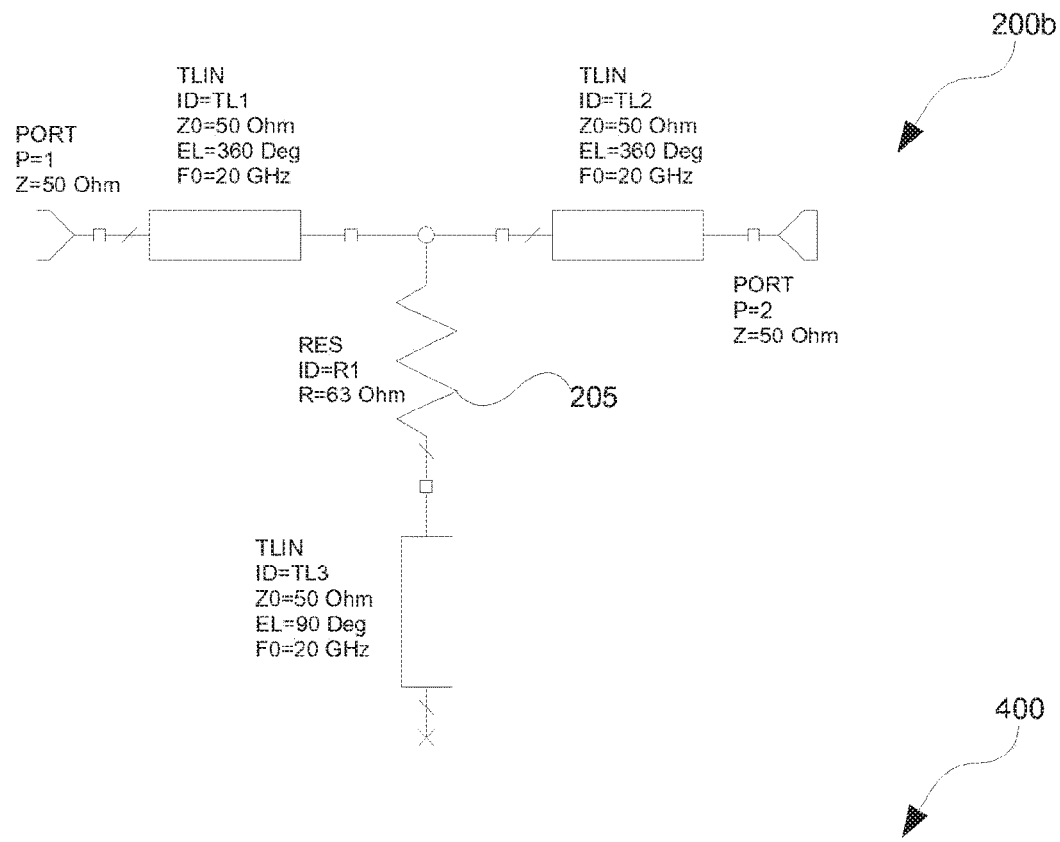
FIG. 5 shows measured responses of a variable equaliser using a PIN diode according to varying bias currents.
Figure 5:
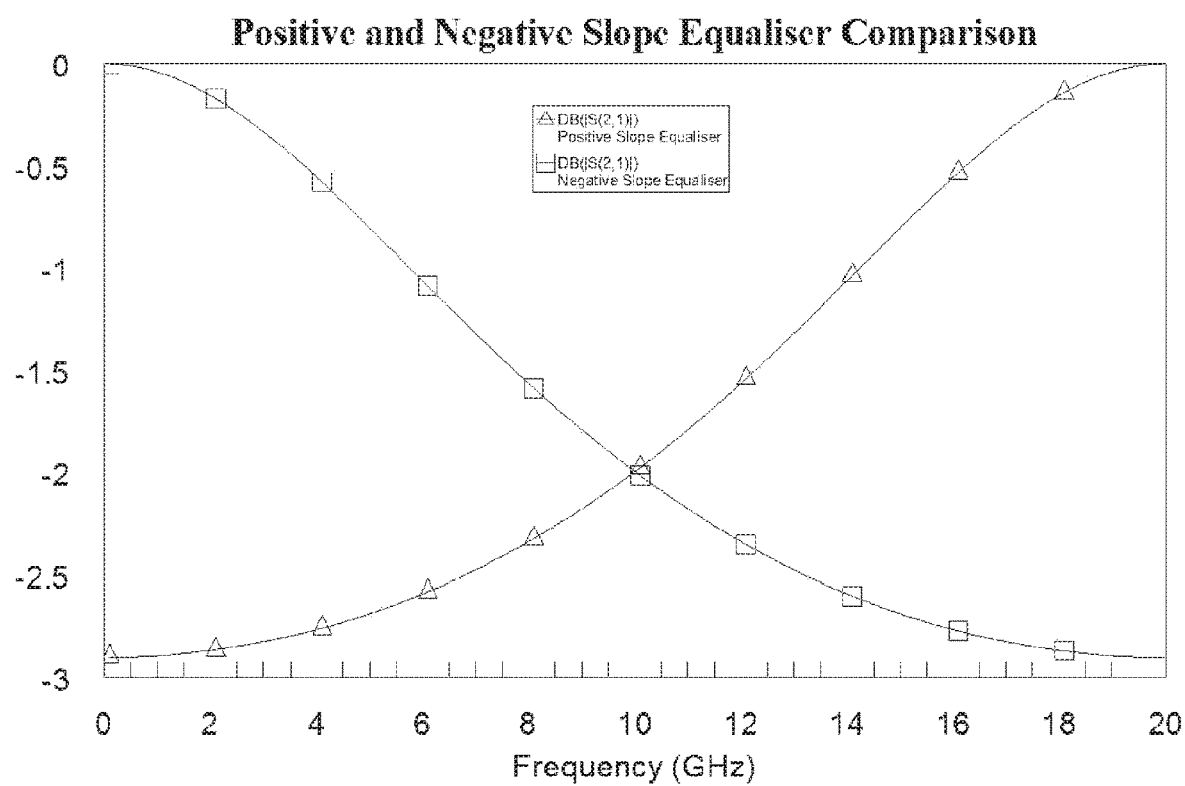

Referring to FIG. 2, the system comprises operating parameter selection means 100 and, referring to FIGS. 3 and 5, the system comprises one or more tuning elements 200 operably coupled to the operating parameter selection means 100. As alluded to above, the operating parameter selection means 100 is adapted for providing one or more operating parameters. Further, the one or more tuning elements are operably coupled to the operating parameter selection means 100, such that the gain shaper is adapted for receiving an operating mode selection, retrieving one or more operating parameters using the operating parameter selection means 100 in accordance with the operating mode, and configuring the one or more tuning elements in accordance with the one or more operating parameters.

Electronic Tuning Circuits

Referring now specifically to the tuning elements, FIG. 3 shows a single stage, positive slope tuning element 200a. The tuning element 200a comprises a resistor 205 connected to a short circuited stub to generate a positive slope in gain across frequency. Such a positive slope is shown in graph 210 showing a simulated response of the tuning element 200a.

The slope of this tuning element 200a can be changed by changing the resistor 205 value, with a lower value increasing the slope and a higher value decreasing the slope.

In a preferred embodiment, the resistor 205 is implemented as a PIN diode allowing for the electronic control of the resistance of the resistor by varying the bias current through the PIN diode. Note that in certain embodiments, other resistive elements may be used instead of a PIN diode. For example, a microwave FET wherein the microwave FET is voltage controlled instead of current controlled.

Figure 4:
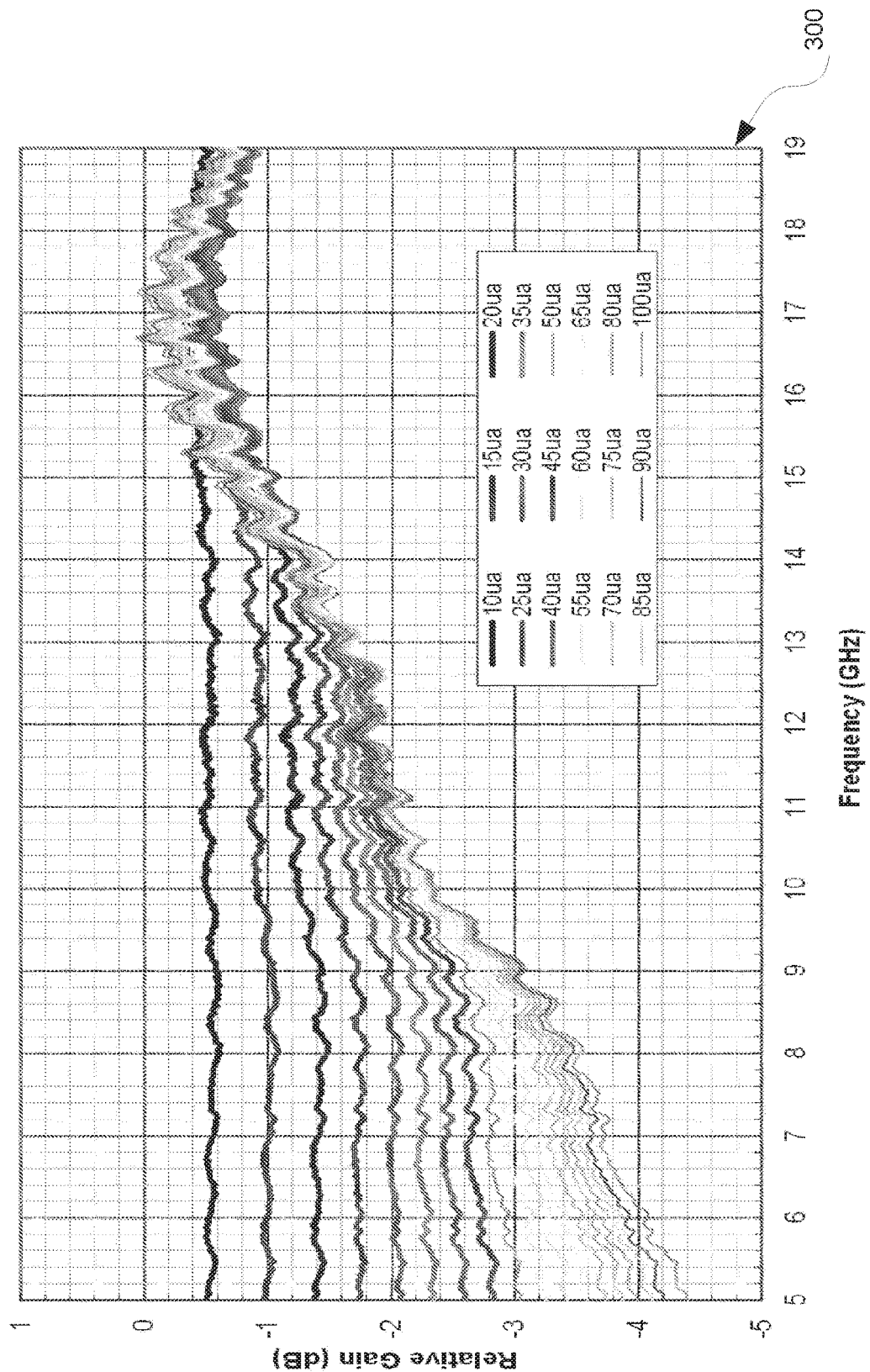

Referring now to FIG. 4, there is shown a graph 300 showing the response for the equaliser circuit across various PIN diode bias currents.

Utilising a PIN diode in this manner allows for a variable equaliser that can be controlled by:
- a fixed current to allow for easier tuning of the circuit 200a by an RF technician by setting a bias point rather than changing a resistor in the RF circuit;
- variable analogue circuit with change based for example on an analogue thermal sensor; or
- digital control in combination with a digital to analogue (DAC) converter.

In a preferred embodiment, the variable equaliser is controlled using digital control in combination with a digital to analogue (DAC) converter as is described herein in further detail.

As the tuning element 200a as shown in FIG. 3 only provides for one tunable aspect, in FIG. 5 there is provided a negative slope tuning element 200b. The negative slope tuning element 200b is the complement of the positive slope tuning element having a short circuited stub in that the negative slope equaliser 200b comprises an open circuit stub. A comparison of the response of the two equalisers is given in graph 400 in FIG. 5.

Figure 6:
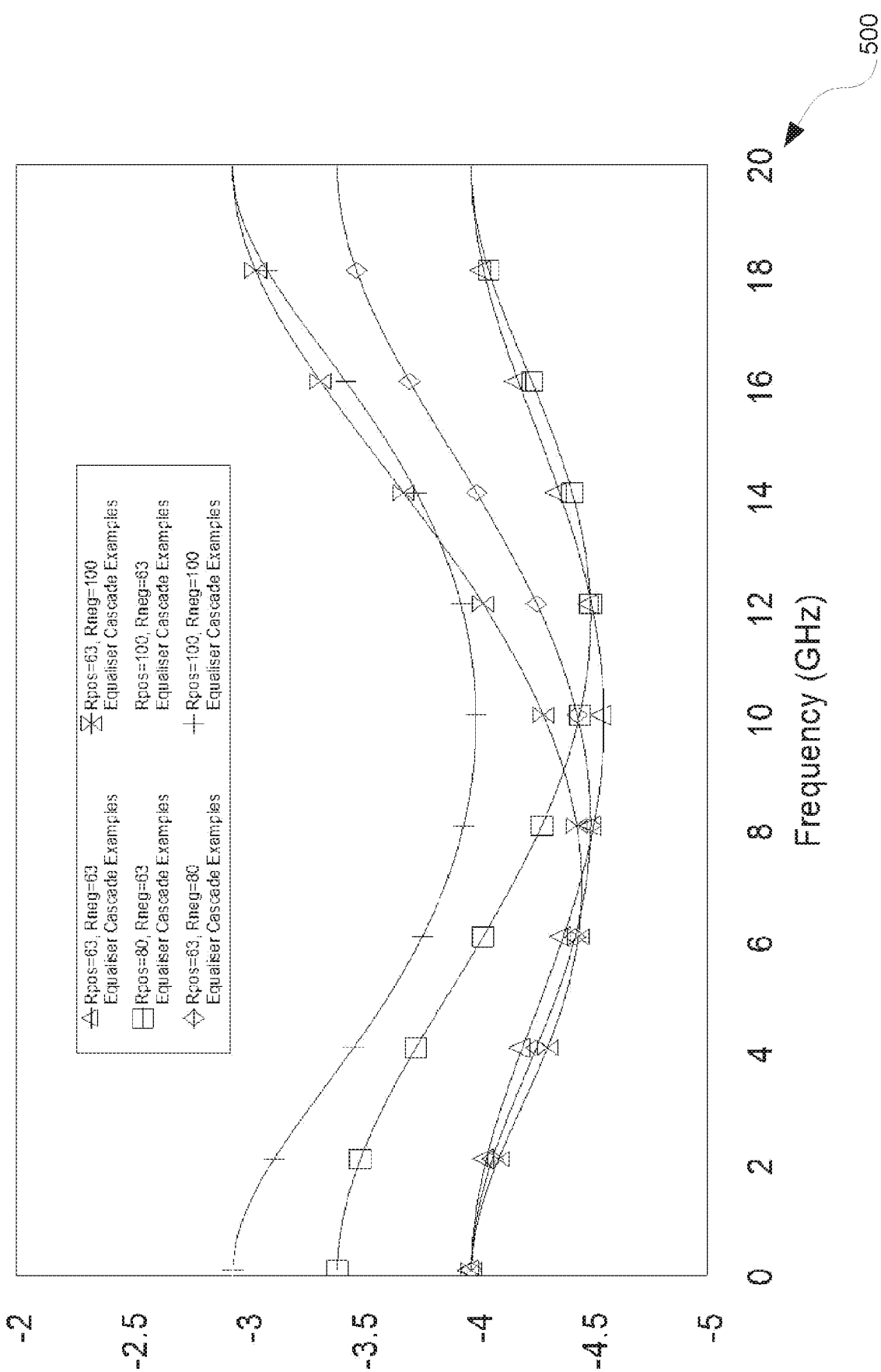
FIG. 6 shows the simulated response of a combination of positive and negative equaliser circuits.

In a preferred embodiment, the one or more tuning elements comprise a combination of a positive slope 200a and negative slope 200b tuning elements to achieve a combination response as shown in graph 500 in FIG. 6. Herein, graph 500 shows the simulated response of a combination of positive and negative equaliser circuits, where Rpos is the value of the resistor in the positive equaliser and Rneg is the value of the resistor in the negative equaliser.

In one embodiment, rather than the tuning elements 200 employing low 'Q' resonant elements as described above, the equalisers 200 comprise higher 'Q' resonant element to provide a tunable depth null across a narrower bandwidth. This higher 'Q' null can be achieved either by a combination of inductors and capacitors, or other distributed methods such as by using a compound stub with two quarter wave sections of different impedances.

Further tuning options are also possible. For example tuning the resonant frequency can be achieved by using a varactor diode as a variable capacitor.

Cascading Tuning Elements

In a preferred embodiment, the one or more tuning elements are two or more tuning elements in cascade. By cascading tuning elements, the response of the gain shaper is further configurable, allowing for n-th order frequency response curves.

Figure 7:
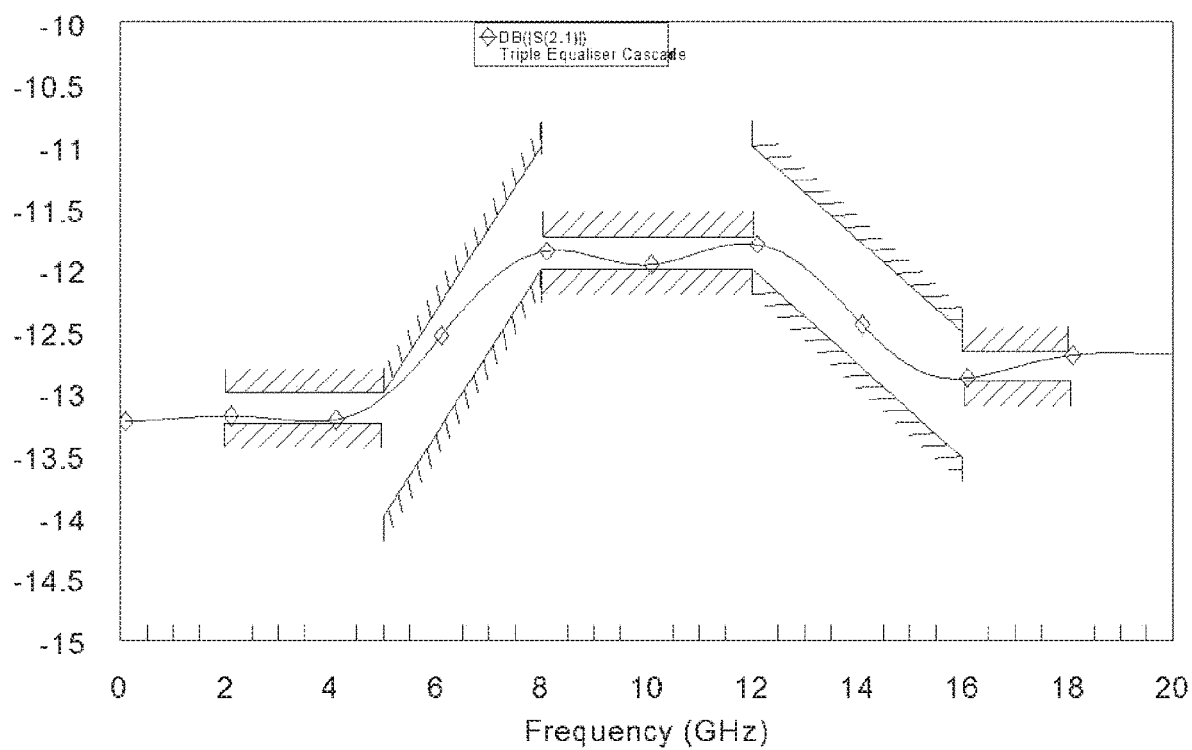
FIGS. 7, 8 and 9 shows exemplary responses of a cascade of variable equaliser circuits in accordance with a preferred embodiment of the present invention.
Figure 8:
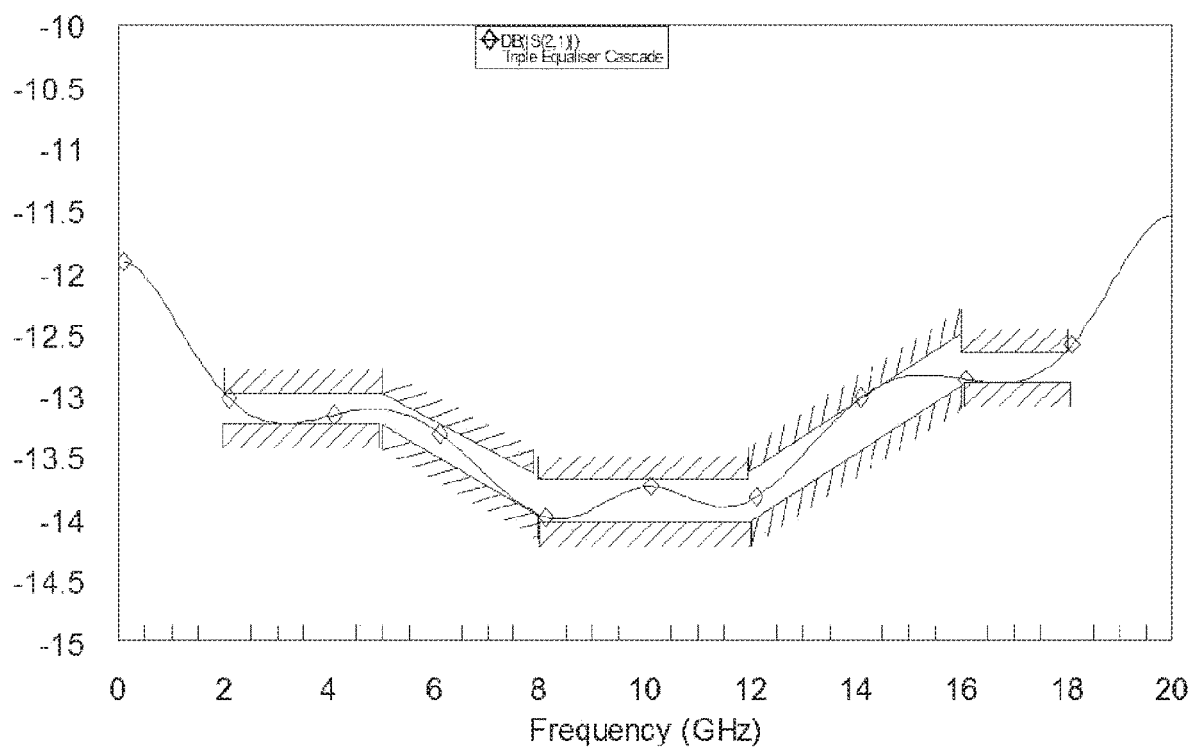
Figure 9:
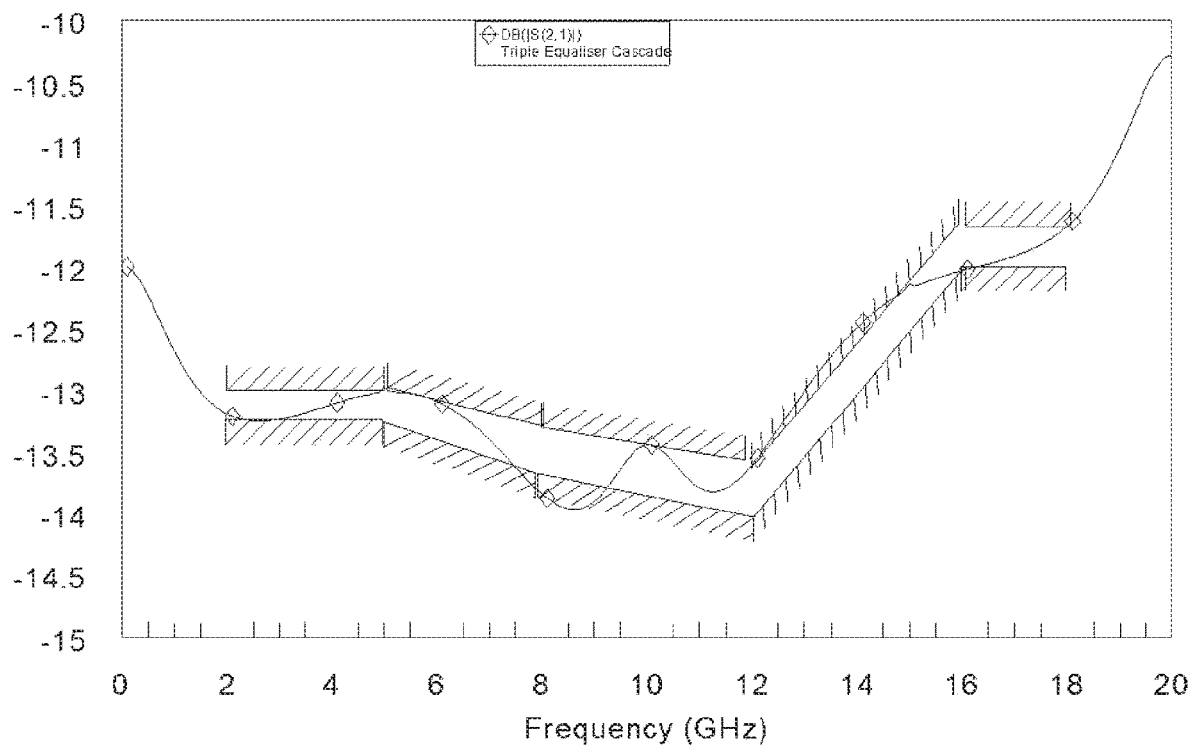

Specifically, by cascading three tuning elements with resonant frequencies of 5 GHz, 10 GHz, and 20 GHz the exemplary responses as shown in FIGS. 7, 8 and 9 may be achieved. Preferably, an amplifier stage is included between each tuning element to provide isolation of return losses from the various equalisers as multiple amplifier stages are usually available in a typical EW front-end circuit.

Integration with FPGA Based Digital Lookup Table

Turning again to FIG. 2, there is shown the operating parameter selection means 100 in accordance with a preferred embodiment. The operating parameter selection means 100 is adapted for configuring the one or more tuning elements described above wherein the tuning elements 200 comprise one or more PIN diodes as a variable resistor.

The operating parameter selection means 100 comprises one or more digital to analogue (DAC) converters 110 each corresponding to a respective PIN diode in a tuning element. Herein, the bias current through the PIN diode can be set digitally by the operating parameter selection means 100 using the digital to analogue (DAC) converter, Each DAC converter 110 is isolated from a respective PIN diode by an isolation amplifier 105. In one embodiment, the isolation amplifier 105 may be omitted such that the DAC converter 110 connects directly to the respective PIN diode.

The operating parameter selection means 100 further comprises an FPGA or microcontroller 115. Furthermore, the operating parameter selection means 100 comprises lookup tables 125. Each lookup table 125 comprises one or more operating triode keys and one or more corresponding operating parameters, and wherein each lookup table 125 is adapted for providing at least one or the one or more corresponding operating parameters in accordance with at least one of the one or more operating mode keys.

The lookup tables 125 may be stored in memory 130, or as FPGA firmware 115.

Furthermore the gain shaper may further comprise gain compensation means (not shown) operably coupled to the operating parameter selection means 100. The gain compensation means may be employed to overcome or reduce the loss introduced by the gain shaper and provide for variable gain compensation to compensate for the bulk shift in gain. The use of the variable gain with the gain shaper is really a use requirement rather than a feature of it. The gain shaper is adapted to switch-in or switch-out (or otherwise configure) the gain compensation means in accordance with gain parameter. In this manner, the gain shaper is adapted for gain compensation across various operating modes of the final EW front-end circuit.

Note that in other embodiments, other compensation means may be used too, such as variable phase shifters and the like.

The operating parameter selection means 100 further comprises a control interface 120 for receiving an operating mode selection. Alternatively or additionally, the operating parameter selection means 100 further comprises a temperature sensor 135 such that the gain shaper can select one or more operating parameters to configure the one or more tuning elements in accordance with the temperature.

Open Loop Adaptive Electronic Gain Shaper

In one embodiment, the gain shaper comprises three tuning elements, each tuning element comprising two PIN diodes. The gain shaper provides table-based control of each PIN diode as a function of frequency band and temperature, implemented by control algorithms executable by the FPGA 115 or microcontroller. The FPGA 115 allows for higher processing speeds than a microcontroller. The lookup tables 125 may be calibrated using appropriate software, such the PC-based LabView™ software. The calibration tables would be stored in non-volatile memory 130, and could be loaded into faster on-board memory during controller operation.

In order to achieve high band switching speeds the gain shaper may employ fast logic and DAC converters 110, or multiple slower controllers 115 with fast analogue multiplexing.

Method for Storing One or More Operating Parameters

Figure 10:
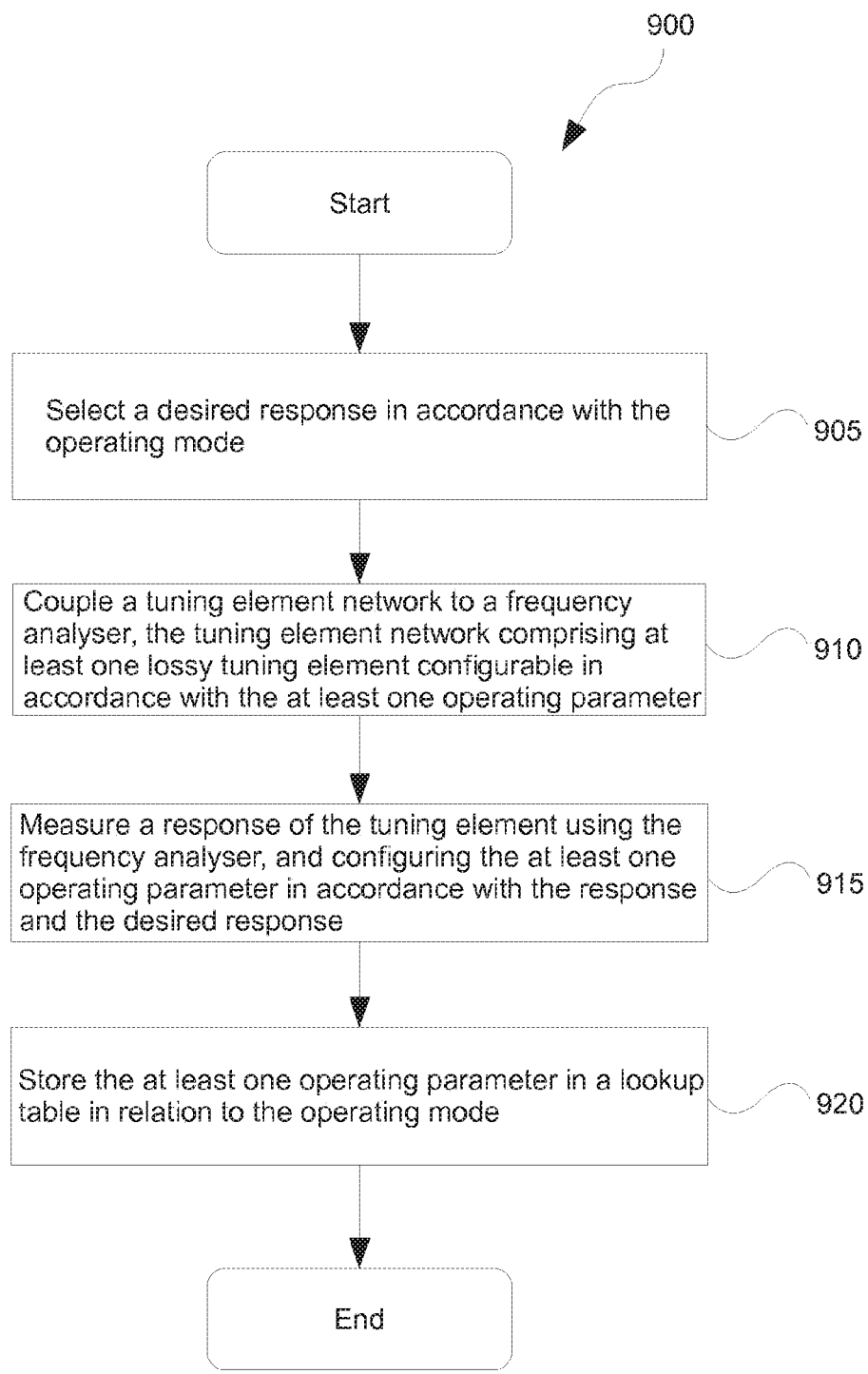
FIG. 10 shows a method for selecting one or more operating parameters in accordance with an operating mode.

Turning now to FIG. 10, there is shown a method 900 for selecting one or more operating parameters in accordance with an operating mode. The method 900 is used for configuring the operating parameter values contained in the lookup tables 125 such that the operating parameter values may be selected in accordance with an operating mode during use.

The method 900 starts at step 905 by selecting a desired response in accordance with an operating mode. The operating mode may be any operating mode as the case may be, including a temperature operating mode wherein for example a desired gain shape response is selected for an operating temperature of 54° C.

At step 910, a tuning element network is coupled to a frequency analyser, the tuning element network comprising at least one lossy tuning element configurable in accordance with the at least one operating parameter. In certain embodiments, the tuning element network may be coupled with the circuits to be compensated so as to measure the tuning element network and circuits to be compensated simultaneously. For example, the tuning element network is connected to a microwave network analyser as well as additional external computer control.

Step 915 comprises measuring a response of the tuning element network using the frequency analyser and step 915 comprises configuring the tuning element network with a set of one or more operating parameters until the response of the tuning element network matches the desired response.

For example, the response of the tuning element network is measured at a required operating mode (such as a temperature operating mode) and the external computer control is used to optimise the response until the best overall response is achieved. A large number of options can be tested by this automated test setup in a short period of time. Such computer control may implement adaptive algorithms such as neural networks, breeder algorithms and the like in optimising the response. Additionally, other operating modes or temperatures can be used to obtain further operating parameters, wherein interpolation could be used to minimise the test time.

Step 920 comprises storing the set of one or more operating parameters in a lookup table 125 in relation to the operating mode. For example, digital operating parameters for each tuning element can be stored into the FPGA lookup table 125 in relation to the operating mode. Hereafter gain shaper operable as an open loop control system.

It should be noted that the electronic gain shaper as described herein is preferably utilised for open loop compensation, however it should be appreciated that the electronic gain shaper may equally be adapted for closed loop compensation systems.

Interpretation

Gain Shaper

It should be noted that the term "gain shaper" is not a term commonly used in the art but as used herein for convenience to describe the claimed invention in contradistinction to prior art matching techniques.

Wide Bandwidth

Wide bandwidth as referred to herein means an octave or more of instantaneous bandwidth.

Lossy

Having or involving the dissipation of electrical or electromagnetic energy.

Processes:

Unless specifically stated otherwise, as apparent from the following discussions, it is appreciated that throughout the specification discussions utilizing terms such as "processing", "computing", "calculating", "determining", "analysing" or the like, refer to the action and/or processes of a computer or computing system, or similar electronic computing device, that manipulate and/or transform data represented as physical, such as electronic, quantities into other data similarly represented as physical quantities.

Processor:

in a similar manner, the term "processor" may refer to any device or portion of a device that processes electronic data, e.g., from registers and/or memory to transform that electronic data into other electronic data that, e.g., may be stored in registers and/or memory. A "computer" or a "computing device" or a "computing machine" or a "computing platform" may include one or more processors.

The methodologies described herein are, in one embodiment, performable by one or more processors that accept computer-readable (also called machine-readable) code containing a set of instructions that when executed by one or more of the processors carry out at least one of the methods described herein. Any processor capable of executing a set of instructions (sequential or otherwise) that specify actions to be taken are included. Thus, one example is a typical processing system that includes one or more processors. The processing system further may include a memory subsystem including main RAM and/or a static RAM, and/or ROM.

Computer-Readable Medium:

Furthermore, a computer-readable carrier medium may form, or be included in a computer program product. A computer program product can be stored on a computer usable carrier medium, the computer program product comprising a computer readable program means for causing a processor to perform a method as described herein.

Networked or Multiple Processors:

In alternative embodiments, the one or more processors operate as a standalone device or may be connected, e.g., networked to other processor(s), in a networked deployment, the one or more processors may operate in the capacity of a server or a client machine in server-client network environment, or as a peer machine in a peer-to-peer or distributed network environment. The one or more processors may form a web appliance, a network router, switch or bridge, or any machine capable of executing a set of instructions (sequential or otherwise) that specify actions to be taken by that machine.

Note that while some diagram(s) only show(s) a single processor and a single memory that carries the computer-readable code, those in the art will understand that many of the components described above are included, but not explicitly shown or described in order not to obscure the inventive aspect. For example, while only a single machine is illustrated, the term "machine" shall also be taken to include any collection of machines that individually or jointly execute a set (or multiple sets) of instructions to perform any one or more of the methodologies discussed herein.

Additional Embodiments:

Thus, one embodiment of each of the methods described herein is in the form of a computer-readable carrier medium carrying a set of instructions, e.g., a computer program that are for execution on one or more processors. Thus, as will be appreciated by those skilled in the art, embodiments of the present invention may be embodied as a method, an apparatus such as a special purpose apparatus, an apparatus such as a data processing system, or a computer-readable carrier medium. The computer-readable carrier medium carries computer readable code including a set of instructions that when executed on one or more processors cause a processor or processors to implement a method. Accordingly, aspects of the present invention may take the form of a method, an entirely hardware embodiment, an entirely software embodiment or an embodiment combining software and hardware aspects. Furthermore, the present invention may take the form of carrier medium (e.g., a computer program product on a computer-readable storage medium) carrying computer-readable program code embodied in the medium.

Carrier Medium:

The software may further be transmitted or received over a network via a network interface device. While the carrier medium is shown in an example embodiment to be a single medium, the term "carrier medium" should be taken to include a single medium or multiple media (e.g., a centralized or distributed database, and/or associated caches and servers) that store the one or more sets of instructions. The term "carrier medium" shalt also be taken to include any medium that is capable of storing, encoding or carrying a set of instructions for execution by one or more of the processors and that cause the one or more processors to perform any one or more of the methodologies of the present invention. A carrier medium may take many forms, including but not limited to, non-volatile media, volatile media, and transmission media.

Implementation:

It will be understood that the steps of methods discussed are performed in one embodiment by an appropriate processor (or processors) of a processing (i.e., computer) system executing instructions (computer-readable code) stored in storage. It will also be understood that the invention is not limited to any particular implementation or programming technique and that the invention may be implemented using any appropriate techniques for implementing the functionality described herein. The invention is not limited to any particular programming language or operating system.

Means for Carrying Out a Method or Function

Furthermore, some of the embodiments are described herein as a method or combination of elements of a method that can be implemented by a processor of a processor device, computer system, or by other means of carrying out the function. Thus, a processor with the necessary instructions for carrying out such a method or element of a method forms a means for carrying out the method or element of a method. Furthermore, an element described herein of an apparatus embodiment is an example of a means for carrying out the function performed by the element for the purpose of carrying out the invention.

Connected

Similarly, it is to be noticed that the term connected, when used in the claims, should not be interpreted as being limitative to direct connections only. Thus, the scope of the expression a device A connected to a device B should not be limited to devices or systems wherein an output of device A is directly connected to an input of device B. It means that there exists a path between an output of A and an input of B which may be a path including other devices or means. "Connected" may mean that two or more elements are either in direct physical or electrical contact, or that two or more elements are not in direct contact with each other but yet still co-operate or interact with each other.

Embodiments:

Reference throughout this specification to "one embodiment" or "an embodiment" means that a particular feature, structure or characteristic described in connection with the embodiment is included in at least one embodiment of the present invention. Thus, appearances of the phrases "in one embodiment" or "in an embodiment" in various places throughout this specification are not necessarily all referring to the same embodiment, but may. Furthermore, the particular features, structures or characteristics may be combined in any suitable manner, as would be apparent to one of ordinary skill in the art from this disclosure, in one or more embodiments.

Similarly it should be appreciated that in the above description of example embodiments of the invention, various features of the invention are sometimes grouped together in a single embodiment, figure, or description thereof for the purpose of streamlining the disclosure and aiding in the understanding of one or more of the various inventive aspects. This method of disclosure, however, is not to be interpreted as reflecting an intention that the claimed invention requires more features than are expressly recited in each claim. Rather, as the following claims reflect, inventive aspects lie in less than all features of a single foregoing disclosed embodiment. Thus, the claims following the Detailed Description of Specific Embodiments are hereby expressly incorporated into this Detailed Description of Specific Embodiments, with each claim standing on its own as a separate embodiment of this invention.

Furthermore, while some embodiments described herein include some but not other features included in other embodiments, combinations of features of different embodiments are meant to be within the scope of the invention, and form different embodiments, as would be understood by those in the art. For example, in the following claims, any of the claimed embodiments can be used in any combination.

Different Instances of Objects

As used herein, unless otherwise specified the use of the ordinal adjectives "first", "second", "third", etc., to describe a common object, merely indicate that different instances of like objects are being referred to, and are not intended to imply that the objects so described must be in a given sequence, either temporally, spatially, in ranking, or in any other manner.

Specific Details

In the description provided herein, numerous specific details are set forth. However, it is understood that embodiments of the invention may be practiced without these specific details. In other instances, well-known methods, structures and techniques have not been shown in detail in order not to obscure an understanding of this description.

Terminology

In describing the preferred embodiment of the invention illustrated in the drawings, specific terminology will be resorted to for the sake of clarity. However, the invention is not intended to be limited to the specific terms so selected, and it is to be understood that each specific term includes all technical equivalents which operate in a similar manner to accomplish a similar technical purpose. Terms such as "forward", "rearward", "radially", "peripherally", "upwardly", "downwardly", and the like are used as words of convenience to provide reference points and are not to be construed as limiting terms.

Comprising and Including

In the claims which follow and in the preceding description of the invention, except where the context requires otherwise due to express language or necessary implication, the word "comprise" or variations such as "comprises" or "comprising" are used in an inclusive sense, i.e. to specify the presence of the stated features but not to preclude the presence or addition of further features in various embodiments of the invention.

Any one of the terms: including or which includes or that includes as used herein is also an open term that also means including at least the elements/features that follow the term, but not excluding others. Thus, including is synonymous with and means comprising.

Scope of Invention

Thus, while there has been described what are believed to be the preferred embodiments of the invention, those skilled in the art will recognize that other and further modifications may be made thereto without departing from the spirit of the invention, and it is intended to claim all such changes and modifications as fall within the scope of the invention. For example, any formulas given above are merely representative of procedures that may be used. Functionality may be added or deleted from the block diagrams and operations may be interchanged among functional blocks. Steps may be added or deleted to methods described within the scope of the present invention.

Although the invention has been described with reference to specific examples, it will be appreciated by those skilled in the art that the invention may be embodied in many other forms.

INDUSTRIAL APPLICABILITY

It is apparent from the above, that the arrangements described are applicable to the electronic control industries.

What is claimed is:

1. An electronic gain shaper of wide instantaneous bandwidth for open loop adaptive optimizing of a broadband microwave circuit(s) to reduce gain ripple caused by a point of initial impedance mismatch in the circuit or other sources of gain ripple, the electronic gain shaper, comprising:

operating parameter selection means adapted for providing two or more operating parameters; and two or more lossy tuning elements arranged in a cascade, each operably coupled to the operating parameter selection means, wherein the two or more lossy tuning elements comprise electronically variable resistive elements, the lossy tuning elements being configured to operate at a position in the circuit away from the point of initial impedance mismatch in the circuit or other sources of gain ripple, and the two or more lossy tuning elements have center frequencies which encompass substantially an octave or more and are configured such that the electronic gain shaper has wide instantaneous bandwidth over which a flat frequency response is provided and wherein, in use, the gain shaper is adapted for:

receiving an operating mode;

retrieving two or more operating parameters from the operating parameter selection means in accordance with the operating mode; and configuring each lossy tuning element in accordance with one of the two or more operating parameters, wherein the gain shaper is operative to account for dynamic gain-affecting factors such as temperature in order to perform dynamic gain shaping across wide bandwidth.

2. The electronic gain shaper as claimed in claim 1, wherein the operating parameter selection means comprises storage means comprising a lookup table.

3. The electronic gain shaper claimed in claim 2, wherein the lookup table comprises one or more operating mode keys and two or more corresponding operating parameters, and wherein the lookup table is adapted for providing at least two of the two or more corresponding operating parameters in accordance with at least one of the one or more operating mode keys.

4. The electronic gain shaper as claimed in claim 1, wherein the operating parameter selection means comprises a FPGA device and wherein the two or more operating parameters comprise resistance parameters.

5. The electronic gain shaper as claimed in claim 1, wherein the variable resistive elements comprise PIN diodes.

6. The electronic gain shaper as claimed in claim 5, wherein the gain shaper is adapted for configuring the resistance of the PIN diodes in accordance with respective bias currents.

7. The electronic gain shaper as claimed in claim 6, further comprising variable analogue circuits for providing the respective bias currents.

8. The electronic gain shaper as claimed in claim 6, further comprising digital to analogue converters coupled to the operating parameter selection means for providing the respective bias currents.

9. The electronic gain shaper as claimed in claim 1, wherein the two or more operating parameters represent gain parameters.

10. The electronic gain shaper as claimed in claim 9, further comprising gain compensation means operably coupled to the operating parameter selection means, and wherein the gain shaper is adapted to configure the gain compensation means in accordance with thegain parameters.

11. The electronic gain shaper as claimed in claim 1, wherein the two or more lossy tuning elements comprise at least one of a positive slope equalizer and a negative slope equalizer.

12. The electronic gain shaper as claimed in claim 11, wherein the positive slope equalizer comprises a short circuit stub.

13. The electronic gain shaper as claimed in claim 11, wherein the negative slope equalizer comprises an open circuit stub.

14. The electronic gain shaper as claimed in claim 1, wherein the two or more lossy tuning elements are connected to high Q-value resonant circuits, each with a resonantfrequency.

15. The electronic gain shaper as claimed in claim 14, wherein the resonant frequency of the high Q-value resonant circuits are tunable.

16. The electronic gain shaper as claimed in claim 1, wherein an amplifier stage is included between the two or more lossy tuning elements to provide isolation of their return losses.

17. The electronic gain shaper of claim 1 wherein wide instantaneous bandwidth of the electronic gain shaper spans 2-18 GHz or more.

18. A method for storing two or more operating parameters in relation to an operating mode of an electronic gain shaper for open loop adaptive optimizing of a broadband microwave circuit to reduce gain ripple caused by a point of initial mismatch or other sources of gain ripple, wherein the method includes configuring lossy tuning elements in accordance with the operating parameters, the method comprising:

selecting a desired response in accordance with the operating mode;

coupling a tuning element network to a frequency analyser, the tuning element network comprising at least two or more lossy tuning elements, each configurable in accordance with one of the operating parameters;

measuring a response of the tuning element network using the frequency analyser, configuring the two or more operating parameters in accordance with the response and the desired response; and storing the two or more operating parameters in a lookup table in relation to the operating mode, wherein the two or more lossy tuning elements comprise electronically variable resistive elements, the lossy tuning elements being configured to operate at a position in the circuit away from the point of initial impedance mismatch in the circuit or other sources of gain ripple, and the two or more lossy tuning elements have centre frequencies which encompass substantially an octave or more and are configured such that the electronic gain shaper has wide instantaneous bandwidth over which a flat frequency response is provided, wherein the gain shaper is operative to account for dynamic gain-affecting factors such as temperature in order to perform dynamic gain shaping across wide bandwidth.

* * * * *